United States Patent [19]

Kunz

[11] Patent Number: 4,739,266
[45] Date of Patent: Apr. 19, 1988

[54] MR TOMOGRAPHY METHOD AND APPARATUS FOR PERFORMING THE METHOD

[75] Inventor: Dietmar W. Kunz, Quickborn, Fed. Rep. of Germany

[73] Assignee: U.S. Philips Corporation, New York, N.Y.

[21] Appl. No.: 939,320

[22] Filed: Dec. 8, 1986

[30] Foreign Application Priority Data

Dec. 12, 1985 [DE] Fed. Rep. of Germany ....... 3543854

[51] Int. Cl.$^4$ ............................................. G01R 33/20
[52] U.S. Cl. ..................................... 324/309; 324/307
[58] Field of Search ............... 324/300, 307, 309, 312, 324/313, 314

[56] References Cited

U.S. PATENT DOCUMENTS

| 4,581,582 | 4/1986 | Redington | 324/309 |
| 4,585,993 | 4/1986 | Bottomley | 324/309 |
| 4,618,827 | 10/1986 | Redington | 324/309 |
| 4,628,262 | 12/1986 | Maudsley | 324/309 |

Primary Examiner—Michael J. Tokar
Attorney, Agent, or Firm—Algy Tamoshunas

[57] ABSTRACT

The invention relates to a method of generating separate fat images and water images and to an apparatus for performing this method. Separate fat images and water images are obtained by means of a sequence consisting of three high-frequency pulses, the second and the third high-frequency pulse having an identical flip angle and being situated at a distance in time from one another which corresponds to half the reciprocal value of the difference between the Larmor frequencies of water-bound hydrogen protons on the one hand and fat-bound hydrogen protons on the other hand, or to an odd multiple thereof.

12 Claims, 3 Drawing Sheets

MR TOMOGRAPHY METHOD AND APPARATUS FOR PERFORMING THE METHOD

The invention relates to an MR tomography method in which, during a plurality of sequences and in the presence of a steady, uniform magnetic field, a high-frequency magnetic field which extends perpendicularly thereto, as well as magnetic gradient fields, are applied to an examination region. During each sequence a first high-frequency pulse is first generated and subsequently a second and a third high-frequency pulse are generated which both have an at least approximately equal flip angle, the time integral over the gradient fields between the second and the third high-frequency pulse being zero. An echo signal occurring during a measurement interval after the third high-frequency pulse is used to generate an image of the examination region. The invention also relates to an apparatus for performing such a method.

A method of this kind is known from EP-OS No. 0 143 602. Each of the three high-frequency pulses has a flip angle of 90°, which means that the nuclear magnetization is rotated through 90° for each pulse. The time interval between the second and the third high-frequency pulse is so small that together they form a 180° pulse so that, in conjunction with the first high-frequency pulse, a pulse sequence is formed which is suitable for the so-called spin echo method (the terms time interval, period of time etc. between signals, pulses, intervals etc. used herein are to be understood to mean the time interval, period of time etc. between the centers of the signals, pulses, intervals etc.).

It is known that the Larmor frequency of fat-bound hydrogen protons deviates slightly from the Larmor frequency of water-bound hydrogen protons (approximately 3.3 ppm). Due to this small difference, the hydrogen protons in fat as well as in water are excited upon excitation by a high-frequency pulse in the known method. Therefore, the echo signal subsequently detected will contain components which depend on the fat distribution in the examination region, as well as components which depend on the water distribution in the examination region. In many cases it is desirable to generate images which represent only the fat distribution (referred to hereinafter as "fat images" for the sake of brevity) or images which represent only the water distribution, referred to hereinafter as "water images".

Various methods are known for the formation of separate fat images and water images.

The so-called CHESS method utilizes high-frequency pulses which have such a narrow band that only the hydrogen protons contained in fat are excited or only those contained in water. This necessitates a long duration of the high-frequency pulse in comparison with the reciprocal value of the difference between said frequencies. Because the Larmor frequencies, and hence also said difference, are proportional to the field strength of the steady, uniform magnetic field, high-frequency pulses having a comparatively long duration will be required notably in the case of low field strength. Therefore, in these cases a comparatively long period of time will expire between the beginning of such a high-frequency pulse and the reception of the echo signal. The resultant increased effect of the relaxation on the echo signal will render the method unsuitable in most cases.

Notably in MR tomography apparatus utilizing low magnetic field strengths, therefore, Dixon's method and related methods have been adopted (Radiology, Vol. 153 (1984), pages 189-194). These methods are based on the formation of a defined phase between the fat image and the water image by spacing the gradient echo and the socalled Hahn echo apart in time in the gradient echo signal. It is then possible to form, in addition to the normal fat-plus-water image, a fat-minus-water image and to calculate pure fat images and pure water images therefrom at a later stage. The drawback of such a method is that, even when only a fat image or a water image is desired, two images must, nevertheless, be formed. Another drawback is that during later calculation of the pure images, no phase errors may be present between the two original images.

It is the object of the present invention to provide a method which enables the formation of fat images or water images without using narrow-band high-frequency pulses and without superposition of mixed images, at a later stage.

On the basis of a method of the kind set forth, this object is achieved in that for the separate formation of fat images or water images, the time interval between the second and the third high-frequency pulse corresponds to half the reciprocal value of the difference between the Larmor frequencies of water-bound and fat-bound hydrogen protons, or to an odd multiple thereof.

The difference between the Larmor frequencies of water-bound and fat-bound hydrogen protons amounts to approximately 3.3 ppm of the relevant Larmor frequency. When the magnetic induction of the steady, uniform magnetic field amounts to, for example 2 Tesla, the Larmor frequency of the hydrogen protons will be approximately 85 MHz and the difference between the Larmor frequencies will be approximately 281 Hz, so that half the reciprocal value amounts to approximately 1.8 ms.

The invention is based on the recognition of the fact that the spin resonance signal occurring after the third pulse consists of a stimulated echo signal and a spin echo signal. The stimulated echo signal occurs a period of time dt1 after the third high-frequency pulse, dt1 being the time interval between the first and the second pulse. The stimulated echo signal has an amplitude which is proportional to the square of the sine of the flip angle. This signal contains the sum of the fat image and the water image.

The spin echo signal contains two components, one of which appears a period of time dt1−dt2 after the second high-frequency pulse, while the other component appears a period of time dt1+dt2 (dt2 being the time interval between the second and third pulse) after the third high-frequency pulse. The two spin echo signal components have an amplitude which is proportional to the flip angle of the second and the third high-frequency pulse, respectively, and which amounts to exactly one half of the amplitude of the stimulated echo signal when the second and the third high-frequency pulse have the same flip angle. The two spin echo components contain the difference image from fat and water. Therefore, the composite echo signal occurring a period of time dt1 after the third high-frequency pulse will depend either only on the fat distribution or only on the water distribution.

In order to form an image, it is known that magnetic gradient field must be applied during or after the described pulse sequence. For the invention this can be performed in a conventional manner. It is essential, however, that the time integral over the gradient fields between the second and the third pulse is zero. The gradient field can be switched in known manner, for example as described in EP-OS No. 0 143 602. The optimum signal-to-noise ratio is obtained in a further version of the invention only in that the position in time of the measurement interval and the variation in time of the gradient fields are chosen so that the time integral over the gradient fields, with the exception of any gradient fields intended for phase encoding, between the first and the second high-frequency pulse is equal to the time interval over these gradient fields between the third high-frequency pulse and the measurement interval, the time interval between the measurement interval and the third high-frequency pulse being equal to the time interval between the second high-frequency pulse and the first high-frequency pulse.

As has already been stated, the second and the third high-frequency pulse must produce the same flip angle. In this respect they must, therefore, be identical. However, they may occupy different phase positions with respect to a coordinate system rotating at the Larmor frequency. Because, as has already been stated, the amplitude of the spin resonance signal is prportional to the square of the sine of the flip angle, in a further version in accordance with the invention the second, as well as the third pulse, has a flip angle of 90°. This is because in that case a spin resonance signal will be obtained which is larger than for any other flip angle. This also holds good when the first high-frequency pulse is a 90° pulse.

The sequence of high-frequency pulses in accordance with the invention produces a spin resonance signal which depends either only on the water distribution or only on the fat distribution in the examination region. For example, when the mean value in time of the frequency corresponds to the Larmor frequency of water for the second and the third high-frequency pulse, the spin resonance signal will depend only on the water distribution in the examination region, while it will depend exclusively on the fat distribution when the mean value of the frequency of each high-frequency pulse corresponds to the Larmor frequency of the fat-bound hydrogen protons. If two different images, representing the fat distribution and the water distribution, respectively, are to be formed in this manner, it will be necessary to repeat the sequences.

However, both types of signals can be received when the sequence in a further version is formed so that in each sequence, subsequent to the third high-frequency pulse, there is also generated a 180° pulse. The position in time of the measurement interval and the variation in time of the gradient fields is such that in the period of time expiring after the high-frequency pulse the time integral over the gradient fields, with the exception of any gradient fields intended for phase encoding, reaches the value of the time integral over this field between the first high-frequency pulse and the 180° high-frequency pulse during the third measurement interval. Thus, in this pulse sequence, a pure fat image or a pure water image will be obtained at the instant dt1 after the third pulse, and the same image will appear a period of time dt3-dt1 after the 180° pulse, dt3 being the interval between the third pulse and the 180° pulse. A period of time dt3 +dt1 after the 180° pulse, however, an image will be formed with the other component (water or fat).

The apparatus for performing the method is characterized in that it includes means for generating a steady, uniform magnetic field, means for generating a high-frequency magnetic field which extends perpendicularly thereto, means for generating magnetic gradient fields, and means for generating a first, a second, and a third high-frequency pulse, the second and the third high-frequency pulse being identical and the distance in time between these pulses corresponding to an odd multiple of half the reciprocal value of the difference between the Larmor frequencies of water-bound and fat-bound hydrogen protons.

The invention will be described in detail hereinafter, with reference to the drawing. Therein:

FIG. 2b shows a modification of FIG. 2a,

Figure 1:
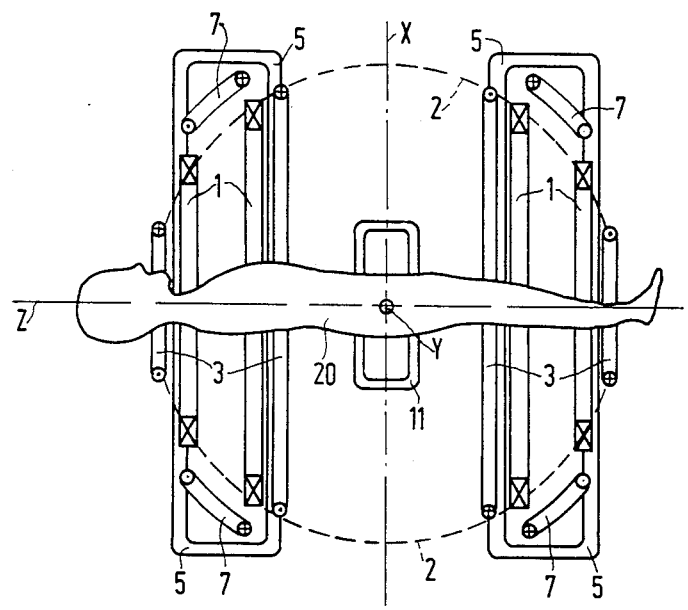
FIG. 1 shows an MR examination apparatus in which the invention can be used.

The MR tomography apparatus diagrammatically shown in FIG. 1 includes a system of four coils 1 for generating a uniform, steady magnetic field of, for example 2T. The coils which are concentrically disposed with respect to the z-axis may be arranged on a spherical surface 2. The patient 20 to be examined is positioned inside these coils.

In order to generate a magnetic field Gz which extends and varies linearly in the z-direction, there are provided four coils 3 which are preferably arranged on the same spherical surface. Also provided are four coils 7 which generate a magnetic field Gx which also extends in the z-direction, but whose gradient extends in the z-direction. A magnetic field Gy which extends in the z-direction with a gradient in the y-direction is generated by four coils 5 which may be identical to the coils 7 but which have been shifted in space through an angle of 90° with respect thereto. Only two of these four coils 5 are shown in FIG. 1.

Because each of the three coil systems 3, 5 and 7 for generating the magnetic gradient fields Gz, Gy and Gx is symmetrically arranged with respect to the spherical surface 2, the field strength in the centre of the sphere, which forms the origin of a cartesian x, y, z coordinate system, will be determined only by the steady, uniform magnetic field of the coil system 1.

Furthermore, a high frequency coil 11 is symmetrically arranged with respect to the plane z=0 of the coordinate system and is constructed so that it can generate an essentially uniform high-frequency magnetic field which extends in the x-direction, that is to say perpendicularly to the direction of the steady, uniform magnetic field. The high-frequency coil receives a high-frequency modulated current from a high-frequency generator during each high-frequency pulse.

Figure 2A:
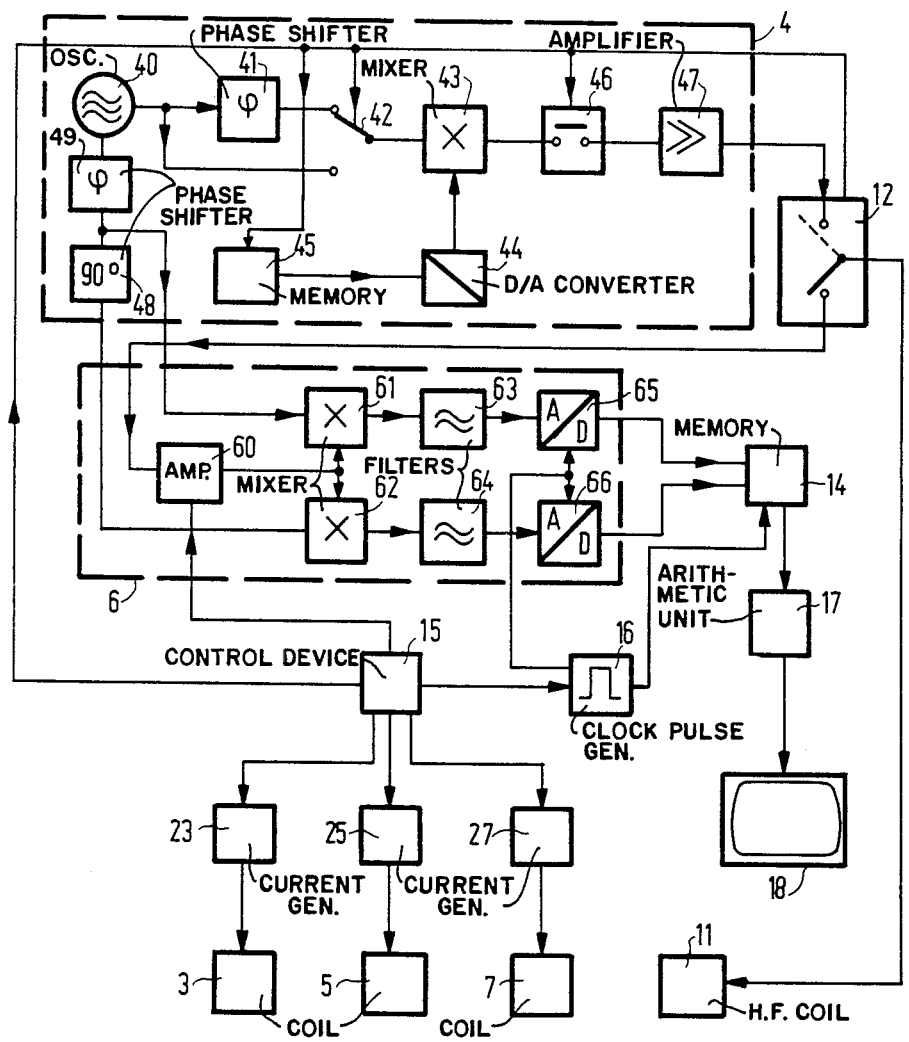
FIG. 2a shows a block diagram of such an apparatus.

FIG. 2a shows a simplified block diagram of an MR tomography apparatus. The high-frequency coil 11 is connected on the one side, via a switching device 12, to a high-frequency generator 4 and on the other side to a high-frequency receiver 6.

The high-frequency generator 4 includes a high frequency oscillator 40 which produces oscillations with a frequency which is equal to the Larmor frequency of the water-bound hydrogen protons for the field intensity generated by the coils 1; for a field strength 2 T, this frequency amounts to approximately 85 MHz. Via a switch 42, the output of the oscillator is connected to an input of a mixing stage 43. In one position of the switch 42, this connection is realized directly, while in the other position (shown in the drawing) the oscillator signal is applied to the input of the mixing stage via an adjustable phase shifter 42. The mixing stage 43 also receives a second input signal from a digital-to-analog converter 44 whose input is connected to a digital memory 45. Under the control of a control device 15 which also controls the switch 42, a series of sampling values representing an envelope signal is read from the memory 45.

The mixing stage 43 processes the input signals applied thereto so that a carrier oscillation modulated by the envelope signal appears on its output. The envelope signal is chosen so that there is formed a preferably amplitude-modulated signal whose bandwidth is substantially larger than the distance between the Larmor frequencies of hydrogen protons bound to fat on the one hand and to water on the other hand. The output signal of the mixing stage 43 is applied, via a switch 46 which is controlled by the control unit 15, to a high-frequency power amplifier 47 whose output is connected to the switching device 12. This device is also controlled by the control unit 15.

The receiver 6 includes a high-frequency amplifier 60 which is connected to the switching device 12 and which receives the spin resonance signals indicated in the high-frequency coil 11 when the switching unit 12 is controlled accordingly. The amplifier 60 includes a muting input which is controlled by the control device 15 and via which the amplifier 60 can be blocked so that the gain is substantially zero. The output of the amplifier 60 is connected to the first inputs of two multiplier mixing stages 61 and 62, each of which supplies an output signal which corresponds to the product of their input signals. The second input of the mixing stages 61 and 62 receives a signal having the frequency of the oscillator 40, a phase shift of 90° existing between the signals of the two inputs. This phase shift is formed by means of a 90° phase shifter 48 whose output is connected to the input of the mixing stage 62 and whose input is connected to the input of the mixing stage 61, the phase shifter 48 being connected to the oscillator 40 via an adjustable phase shifter 49.

The output signals of the mixing stages 61 and 62 are applied to a respective analog-to-digital converter 65, 66, respectively, via low-pass filters 63 and 64 which suppress the oscillator frequency as well as all frequencies exceeding the oscillator frequency and which conduct only low-frequency components. These converters convert the analog signals of the circuit 61...64, forming a quadrature demodulator, into digital data words which are applied to a memory 14. The analog-to-digital converters 65 and 66 and the memory 14 receive their clock pulses from a clock pulse generator 16 which is blocked and enabled, via a control line, by the control unit 15, so that the signals supplied by the high frequency coil 11 and transposed to the low-frequency range can be converted into a series of digital data words for storage in the memory 14 only during a measurement interval which is defined by the control unit 15.

An arithmetic unit 17 determines the spatial distribution of the nuclear magnetization in the examination region on the basis of the values in the memory 14 and applies the distribution determined to a suitable display unit, for example a monitor 18. The three coil systems 3, 5 and 7 are powered by the current generators 23, 25 and 27 with a respective current whose variation in time can be controlled by the control unit 15.

Figure 3:
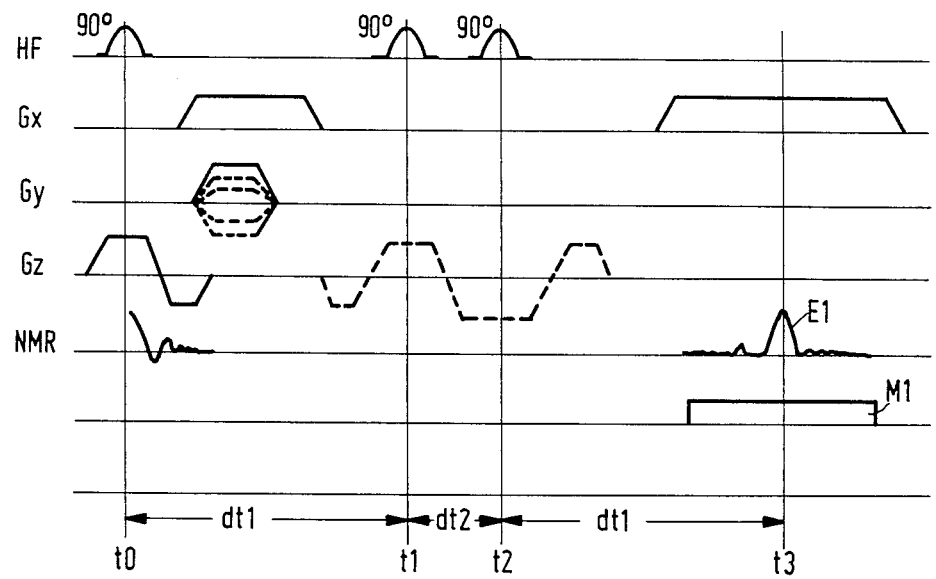
FIG. 3 shows the variation in time of different signals in a sequence in accordance with the invention.

FIG. 3 shows the variation in time of different signals in the MR examination apparatus. The first line shows the sequence of the high-frequency pulses, while the last line represents the time axis. The sequence consists of three high-frequency pulses, each of which has a flip angle of 90°. The first 90° high-frequency pulse at the instant $t=t0$ is followed at a time interval dt1 by a second high-frequency pulse at the instant $t=t1$. The value dt1 corresponds to the time interval between the second pulse and the preceding 90° pulse in a spin echo sequence. At the instant, a third 90° high-frequency pulse is generated at a time interval from the second high-frequency pulse corresponding to dt2. For each high-frequency pulse the switch 46 is closed and the switching unit 12 is in the position indicted by the dotted lines in FIG. 2a.

The fourth line shows the variation in time of the magnetic gradient field Gz. This field is active during the first high-frequency pulse and ensures that spin resonance can be excited only in a layer which is symmetrical with respect to the plane $z=0$. The variation in time of the current supplied by the current generator 23 for the gradient coils 3 is controlled by the control unit 15 so that the time integral over the magnetic gradient field becomes zero in the interval from t0 to t1.

After the first high-frequency pulse, the current generator 25 is controlled so that during a fixed period of time within the interval $t0-t1$, the coil system 5 generates a magnetic gradient field Gy whose amplitude varies from one sequence to another as denoted by broken lines. After deactivation of this gradient field, therefore, the nuclear magnetization in the individual points of the excited layer has a phase position which depends linearly on the y-coordinate. This magnetic gradient field serves for phase encoding and enables the reconstruction of the spatial distribution of the nuclear magnetization on the basis of the spin resonance signals.

The fifth line shows the variation in time of the spin resonance signals. In addition to a so-called FID signal occurring immediately after the first high-frequency pulse, a further spin resonance signal E1 occurs. This signal is composed of a stimulated echo component and a spin echo component.

The stimulated echo component reaches its maximum value at the instant t3 at an interval from the third high-frequency pulse which corresponds to the interval in time dt1 between the second and the first high-frequency pulse, that is to say at the instant $t2+dt1$. The stimulated echo component corresponds to the sum of the water signal and the fat signal. The water signal is deemed to be the component of the echo signal which appears as a stimulated echo and which would occur if no fat were present in the examination region symbolized by the patient 20; analogously, "fat signal" represents the stimulated echo signal which would occur in the absence of water in the examination region.

In addition to the stimulated echo component, the echo signal occurring at the instant t3 also includes two spin echo components. One spin echo component reaches its maximum value at $t3-dt2$, while the other component reaches its maximum value at $t3+dt2$. Thus, the two maximum values are situated on both sides of the maximum value of the stimulated echo component at a distance in time dt2 therefrom. Both components are also composed of a fat signal and a water signal. The water signal, however, has the same phase position as the water signal in the stimulated echo component because the frequency of the carrier oscillation is equal to the Larmor frequency of water-bound hydrogen protons. However, the fat signal in the various echo components has a phase position which depends on the length of the time interval between the maximum values of the various components as well as on the difference between the Larmor frequencies for fat and water. When the relation $$dt2 = 0.5 \, n/df$$

holds good, where n is an odd number and df is the amount of the difference between the Larmor frequencies of water-bound and fat-bound hydrogen protons, the phase shift of the fat signals in the two spin echo components amounts to exactly $+180°$ and $-180°$, respectively, so that the fat signals compensate, i.e. cancel, one another and the composite echo signal occurring at the instant t3 is a pure water signal.

Therefore, as appears from the sixth line, in order to determine the pure water signal, the composite echo coil induced in the high-frequency signal 11, or a separate receiving coil, is converted, after demodulation, into a series of digital sampling values during a measurement interval M1. The sampling values being used to reconstruct an image of the water distribution after application of further sequences with modified gradient fields and sampling of the echo signals then occurring at the corresponding instants. The position in time of this measurement interval and the variation in time of the magnetic gradient field Gx generated in the coil 7 by means of the current generator 27 are chosen so that the time integral over the magnetic gradient field after the third high-frequency pulse reaches the same value during the measurement interval as the time integral over the same gradient field already active during the interval from t0 to t1 between the two high-frequency pulses. Preferably, the measurement interval M1 is symmetrically situated with respect to the instant t3 and said integrals become equal at the same instant; the optimum signal-to-noise ratio will then be obtained.

In order to ensure that the described formation of a pure water image (or a pure fat image) is not disturbed, it is important that, if a magnetic gradient field is present during the period of time between t1 and t2, then the field should be shaped (as denoted by broken lines in FIG. 3) so that the time integral over the magnetic field is zero in the period of time between t1 and t2. This variation of the magnetic gradient field Gx is required when, after the sequence shown, first echo signals are to be derived from a neighbouring layer by means of a corresponding sequence (so-called multi-slice technique). This is because the field denoted by broken lines prevents resonant excitation of the neighbouring layer (or other layers) by the preceding sequence.

It will be apparent from the foregoing that the method described thus far produces a pure water image, because the frequency of the oscillation generated by the oscillator 19 equals the Larmor frequency of the water-bound hydrogen protons. It will be appreciated that a pure fat image will be obtained when the oscillator frequency corresponds to the Larmor frequency of fat-bound hydrogen protons. In order to enable the formation of a pure fat image or a pure water image at option, therefore, it must be possible to switch the oscillator from one frequency to the other frequency, so that the sequences can each time be executed with the one or the other carrier frequency.

However, the frequency of the oscillator may alternatively remain unchanged when the phase position of the rotating components of the high-frequency magnetic field in a coordinate system rotating about the z-axis at the Larmor frequency, is shifted through 180°.

Figure 2B:
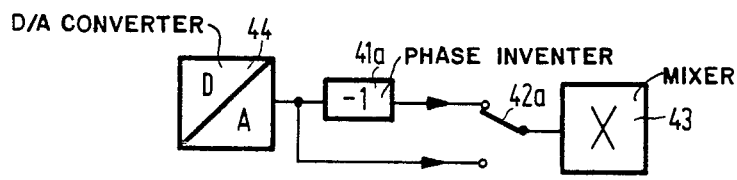

One possibility of realizing the phase reversal of the third pulse is to switch between the second and the third pulse, the input of the mixing stage 43 from the output of the oscillator 40 to the output of the phase shifter 41 which carries a signal which has been shifted through 180° with respect to the signal on the output of the oscillator. Another possibility of realizing the described 180 reversal for the third pulse is to invert the phase position of the envelope signal. In accordance with FIG. 2b this can be realized, for example by switching a switch 42a (which should also be controlled by the control unit 15) between the second and the third high-frequency pulse from its position shown, in which it connects the output of a phase inverter 41a succeeding the digital-to-analog converter 44 to the input of the mixing stage 43, to the position not shown in which it connects the output of the digital-to-analog converter 44 directly to the input of the mixing stage 43.

However, it is not necessary for the frequency of the oscillator to correspond to the Larmor frequency of either water or fat. The frequency may also have a different value. However, in that case the phase position of the third high-frequency pulse must be varied with respect to that of the second high-frequency pulse, that is to say through the phase angle covered by an oscillation having the difference frequency between the Larmor frequency of fat or water, on the one hand, and the oscillator frequency, on the other hand, in the period of time dt2 between the second and the third high-frequency pulse. When the frequency of the oscillator is, for example, exactly in the center of the Larmor frequencies for fat and water, the phase position must be switched through $-90°$ for fat and through $+90°$ for water between the second and the third high-frequency pulse. In that case, therefore, the phase shift by the phase shifter 41 or 42 must be adjusted to $+90°$ or $-90°$.

Figure 4:
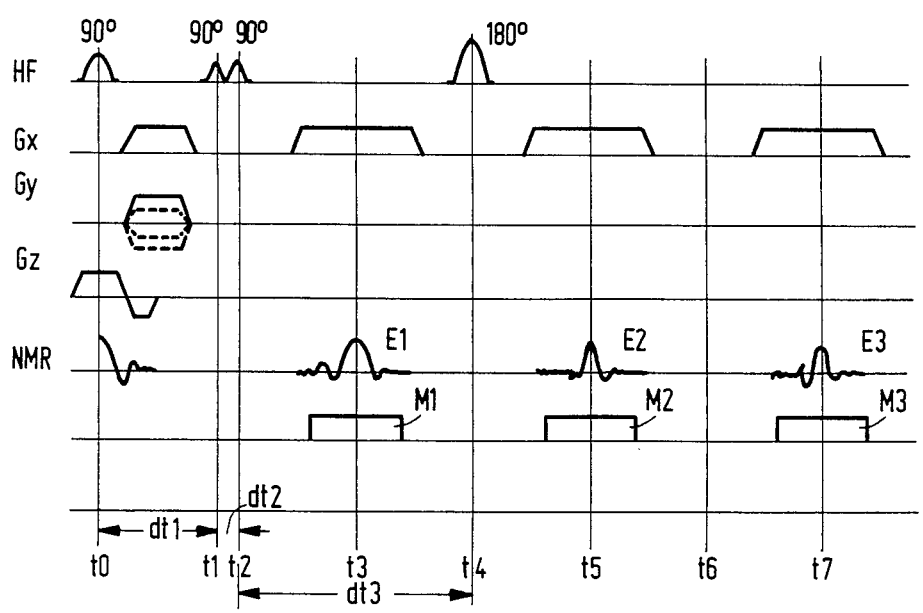
FIG. 4 shows the variation in time of the signals in a modified sequence.

FIG. 4 shows an extended version of the pulse sequence in accordance with the invention which is identical to the previously described sequence until the instant t2. In the extended version, after a time interval dt3 from the third high-frequency pulse, that is to say at the instant t4, a further high-frequency pulse is generated which, however, has a flip angle of 180°. When the carrier frequency for this pulse corresponds to the Larmor frequency of water-bound hydrogen protons, at the instant t3 a first echo signal E1 will appear which is determined exclusively by the water distribution as has already been explained with reference to FIG. 3. At the instant t5, that is to say a period of time dt3−dt1 after the 180° pulse, there will appear further echo signal E2 which is also a pure water signal. At the instant t7, occurring a period of time dt3+dt1 after the 180° pulse, there will appear an echo signal E3 which is determined exclusively by the fat distribution. The three echo signals E1, E2 and E3 are sampled in the presence of a measurement gradient Gx (see line 2 of FIG. 4) during the measurement intervals M1, M2 and M3 (see line 6). Water signals (E1, E2) and a fat signal (E3) can thus be extracted by means of a single sequence.

The appropriate choice of the variation in time of the measurement gradient field Gx and the position in time of the measurement interval in order to enable evaluation of the echo signal E1, has already been described with reference to FIG. 1.

In order to enable the reception of the second echo signal E2, the gradient fields must satisfy given integral conditions, with the exception of the gradient field Gy which serves for phase encoding. Because the integral over the magnetic gradient field Gz is zero during the interval between t0 and t1 and this gradient field is not switched during the subsequent period of the sequence, it holds good for the gradient field Gx that the sum of the integrals over this gradient field in the period of time between t0 and t1 and in the period of time elapsing after the 180° pulse (t4) must reach the same value for the determination of E2 during the measurement interval M2 as the time integral over this gradient field during the period of time between the third high-frequency pulse (t2) and the 180° pulse (t4). An optimum signal-to-noise ratio will again be obtained if this condition is satisfied at the instant t=t5 and if the measurement interval M2 (line 6) is symmetrically situated with respect to t5.

In order to enable reception of the third echo signal E3, the time integral over the gradient field Gx in the period of time after the 180° pulse must reach the same value during a measurement interval M3 as the integral over this gradient field between the first (90°) high-frequency pulse and the 180° high-frequency pulse, that is to say in the period of time from t1 to t4. Optimum circumstances will again be obtained if this condition is satisfied at the instant t=t7 and if the measurement interval is symmetrically situated with respect to this instant.

When, contrary to FIGS. 3 and 4, the time integrals over the gradient field in the periods of time between the first and the second high-frequency pulse as well as between the third high-frequency pulse and the 180° pulse are not equal to zero, these integrals must satisfy the following condition in order to achieve optimum reception of the signals E1, E2, E3: for optimum reception of E1 the time integral over Gz must be equal, from the first high-frequency pulse to the second high-frequency pulse, to the integral from the third high-frequency pulse to the beginning of the measurement integral M1. For optimum reception of E2 the time integral over Gz must be equal, from the third high-frequency pulse to the 180° pulse, to the sum of the integrals from the first high-frequency pulse to the second high-frequency pulse and from the 180° pulse to the beginning of the measurement interval M2. For optimum reception of E3 the time integral over Gz from the first high-frequency pulse to the 180° pulse must be equal to the integral from the 180° pulse to the beginning of the measurement interval M3.

As has already been stated, the second and the third high-frequency pulse must be identical as regards flip angle in the method described with reference to FIG. 3. However, the flip angle need not amount to 90°, even though that value results in the best signal-to-noise ratio. In the extended sequence shown in FIG. 4 the flip angle of the second and the third high-frequency pulse, however, must amount to 90°.

The method shown in FIG. 4 can be further extended in that at a distance in time of 2dt3 or 4dt3, 6dt3, etc. after the 180° pulse one or more further 180° pulses are applied, thus forming further echo signals which have been influenced exclusively by the water distribution or exclusively by the fat distribution. At a distance in time dt3 after the first 180° pulse, that is to say at the instant t=t6, however, no 180° pulse may be added, because the third echo signal E3, like the first two echo signals E1 and E2, would then be determined exclusively by the water distribution.

Thus far the formation of an image of a layer extending perpendicularly to the z-axis has been described. However, the same method can be used also for forming layer images in other directions in known manner by exchanging the activation of the gradients.

The method described with reference to the figures 3 and 4 is a so-called two-dimensional Fourier transformation method. The invention, however, can also be used for a three-dimensional Fourier transformation method where in the individual sequences, in addition to the field Gy, the magnetic gradient field Gz is also varied from one sequence to another for phase encoding. The invention can also be used for so-called projection-reconstruction methods. This method deviates from the method described with reference to FIG. 3 in that, instead of varying the magnitude of the gradient from one sequence to another, the direction of the gradient is varied whilst the amount of the gradient remains constant. In that case no phase encoding takes place, but rather frequency encoding; the gradient fields intended for frequency encoding must then satisfy the integral conditions described above.

What is claimed is:

1. An MR tomography method in which, during a plurality of sequences and in the presence of a steady, uniform magnetic field, as well as magnetic gradient fields applied to an examination region, in each sequence a first high-frequency pulse is generated and subsequently a second and a third high-frequency pulse are generated so as to produce a high-frequency magnetic field which extends perpendicular to the direction of the steady field, which second and third pulses both have approximately equal flip angles, the time integral over the gradient fields between the second and the third high-frequency pulse being zero, an echo signal occurring during a measurement interval after the third high-frequency pulse being used for generating an image of the examination region, characterized in that for separate formation of fat images or water images, the time interval between the second and the third high-frequency pulse corresponds to half the reciprocal value of the difference between the Larmor frequencies of water-bound and fat-bound hydrogen protons, or to an odd multiple thereof.

2. A method as claimed in claim 1, characterized in that the position in time of the measurement interval and the variation in time of the gradient fields are chosen so that the time integral over the gradient fields, with the exception of any gradient fields intended for phase encoding, between the first and the second high-frequency pulse is equal to the time integral over these gradient fields between the third high-frequency pulse and the measurement interval, the time interval between the measurement interval and the third high-frequency pulse being equal to the time interval between the second high-frequency pulse and the first high-frequency pulse.

3. A method as claimed in claim 1 or 2, characterized in that the second as well as the third pulse has a flip angle of 90°.

4. A method as claimed in claim 3, characterized in that in each sequence, subsequent to the third high-frequency pulse, a further, 180° pulse is generated and an echo signal is sampled during a further measurement interval, the position in time of the further measurement interval and the variation in time of the gradient fields being such that in the period of time expiring after the further high-frequency pulse, the time integral over the gradient fields, with the exception of any gradient fields intended for phase encoding, reaches the value of the time integral over these fields between the first high-frequency pulse and the further high-frequency pulse during the further measurement interval.

5. A method as claimed in claim 4, characterized in that the position in time of the further measurement interval and the variation in time of the gradient fields are chosen so that the time interval between the further measurement interval and the further high-frequency pulse is equal to the sum of the time interval between the first and the second high-frequency pulse and the time interval between the third and the further high-frequency pulse.

6. A method as claimed in any one of claims 1 or 2, characterized in that the mean value in time of the frequency of the high-frequency pulse corresponds to the Larmor frequency of water-bound or fat-bound hydrogen protons.

7. A method as claimed in claim 1 or 2, characterized in that the phase of the third high-frequency pulse is shifted with respect to the phase of the second high-frequency pulse through an angle which is covered by an oscillation having the difference frequency between the oscillator frequency and the Larmor frequency of fat or water in the period of time elapsing between the second high-frequency pulse and the third high-frequency pulse.

8. An MR tomography apparatus comprising means for generating a steady, uniform magnetic field in an examination region, means for generating at least one magnetic gradient field in said region, means for generating a first, second and third high-frequency pulse so as to produce, during each pulse, a high-frequency magnetic field which extends perpendicularly to the direction of said steady field, said first and second pulses being spaced from each other by a first time interval and said second and third pulses being spaced from each other by a second time interval, said second and third pulses having approximately equal flip angles, means for sampling an echo signal occurring during a measurement interval which follows said third pulse, and means for producing an image of said region from samples of said echo signal, wherein said at least one gradient field is generated during said first interval and during said measurement interval, the time integral over said at least one gradient field being zero during said second interval, and wherein the duration of said second time interval corresponds to an odd multiple of half the reciprocal value of the difference between the Larmor frequencies of water-bound and fat-bound hydrogen protons.

9. An apparatus as claimed in claim 8, wherein the means for generating the high-frequency pulses include an oscillator for generating a carrier having a frequency equal to the Larmor frequency, a generator for generating an envelope signal, and means for mixing said carrier and envelope signal so as to produce an output signal which corresponds to the product of the carrier and the envelope signal.

10. An apparatus as claimed in claim 9, including means for switching the phase position of the envelope signal or the carrier between the second and the third high-frequency pulse.

11. An apparatus as claimed in claim 8 the oscillator frequency can be switched from the Larmor frequency of the fat-bound hydrogen protons to the Larmor frequency of the water-bound hydrogen protons.

12. An apparatus as claimed in claim 8 wherein said means for generating the high-frequency pulses includes further means for generating a further, 180° pulse after the third high-frequency pulse.

* * * * *